(12) United States Patent
Guo et al.

(10) Patent No.: US 8,283,217 B2
(45) Date of Patent: Oct. 9, 2012

(54) PREVENTION OF OXYGEN ABSORPTION INTO HIGH-K GATE DIELECTRIC OF SILICON-ON-INSULATOR BASED FINFET DEVICES

(75) Inventors: Dechao Guo, Wappingers Falls, NY (US); Unoh Kwon, Fishkill, NY (US); Chun-Chen Yeh, Clifton Park, NY (US); Zhen Zhang, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 201 days.

(21) Appl. No.: 12/717,439

(22) Filed: Mar. 4, 2010

(65) Prior Publication Data

US 2011/0215405 A1    Sep. 8, 2011

(51) Int. Cl.
*H01L 21/00* (2006.01)
(52) U.S. Cl. ........................ 438/151; 257/347
(58) Field of Classification Search .................. 257/347; 438/151
See application file for complete search history.

(56) References Cited

U.S. PATENT DOCUMENTS

| | | | |
|---|---|---|---|
| 6,037,639 A | 3/2000 | Ahmad | |
| 7,071,010 B1 | 7/2006 | Lille | |
| 7,396,776 B2 | 7/2008 | Chou et al. | |
| 7,485,516 B2 | 2/2009 | Dyer et al. | |
| 7,514,346 B2 | 4/2009 | Chau et al. | |
| 2005/0269640 A1 | 12/2005 | Shimamoto et al. | |
| 2006/0001095 A1 | 1/2006 | Doris et al. | |
| 2007/0057325 A1* | 3/2007 | Hsu et al. | 257/347 |
| 2007/0134859 A1 | 6/2007 | Curello et al. | |
| 2007/0138555 A1 | 6/2007 | Bhattacharyya | |
| 2008/0001176 A1* | 1/2008 | Gopalakrishnan et al. | 257/211 |
| 2008/0093669 A1 | 4/2008 | Iwamatsu | |
| 2008/0111185 A1 | 5/2008 | Cheng | |

OTHER PUBLICATIONS

N. D. Theodore et al.; TFSOI with Improved Oxidation Resistance (To Reduce Isolation Induced Stresses and Leakage); Motorola Technical Developments; Nov. 1996; pp. 158-159.

* cited by examiner

*Primary Examiner* — Julio J Maldonado
*Assistant Examiner* — Robert Bachner
(74) *Attorney, Agent, or Firm* — Cantor Colburn LLP; Vazken Alexanian

(57) ABSTRACT

A method of forming fin field effect transistor (finFET) devices includes forming a plurality of semiconductor fins over a buried oxide (BOX) layer; performing a nitrogen implant so as to formed nitrided regions in a upper portion of the BOX layer corresponding to regions between the plurality of semiconductor fins; forming a gate dielectric layer over the semiconductor fins and the nitrided regions of the upper portion of the BOX layer; and forming one or more gate electrode materials over the gate dielectric layer; wherein the presence of the nitrided regions of upper portion of the BOX layer prevents oxygen absorption into the gate dielectric layer as a result of thermal processing.

15 Claims, 9 Drawing Sheets

PREVENTION OF OXYGEN ABSORPTION INTO HIGH-K GATE DIELECTRIC OF SILICON-ON-INSULATOR BASED FINFET DEVICES

BACKGROUND

The present invention relates generally to semiconductor device manufacturing and, more particularly, to preventing oxygen absorption into high-k gate dielectric layers of silicon-on-insulator (SOI) based finFET devices.

Fin field effect transistor (finFET) technology is an emerging technology that provides solutions to metal oxide semiconductor FET (MOSFET) scaling problems at and below the 45 nanometer (nm) node. A finFET is a MOSFET that is formed on a semiconductor fin. For example, a finFET includes at least one narrow (e.g., <10 nm wide) semiconductor fin gated on at least two opposing sides of the fin. FinFET structures are advantageously formed on a semiconductor (e.g., silicon)-on-insulator (SOI) substrate, because of the precise control of the fin height, which is determined by the substrate silicon thickness, as well as the ease of electrical isolation by shallow trench isolation structures.

Another area of advancing technology that provides enhanced performance for MOSFET scaling problems is the development of so-called "high-k gate" dielectric materials. High gate leakage current of nitrided silicon dioxide and the depletion effect of polysilicon gate electrodes limit the performance of conventional silicon oxide-based gate electrodes. High performance devices for an equivalent oxide thickness (EOT) less than 1 nm require high-k gate dielectric materials and metal gate electrodes to limit the gate leakage current and provide high on-currents. More specifically, high-k gate dielectric materials refer to dielectric metal oxides or dielectric metal silicates having a dielectric constant that is greater than the dielectric constant of silicon oxide (i.e., greater than about 3.9).

SUMMARY

In an exemplary embodiment, a method of forming fin field effect transistor (finFET) devices includes forming a plurality of semiconductor fins over a buried oxide (BOX) layer; performing a nitrogen implant so as to formed nitrided regions in a upper portion of the BOX layer corresponding to regions between the plurality of semiconductor fins; forming a gate dielectric layer over the semiconductor fins and the nitrided regions of the upper portion of the BOX layer; and forming one or more gate electrode materials over the gate dielectric layer; wherein the presence of the nitrided regions of upper portion of the BOX layer prevents oxygen absorption into the gate dielectric layer as a result of thermal processing.

In another embodiment, a fin field effect transistor (finFET) device, includes a plurality of semiconductor fins formed over a buried oxide (BOX) layer; a plurality of nitrided regions formed in a upper portion of the BOX layer corresponding to regions between the plurality of semiconductor fins; a gate dielectric layer formed over the semiconductor fins and the plurality of nitrided regions of the upper portion of the BOX layer; and one or more gate electrode materials formed over the gate dielectric layer; wherein the presence of the nitrided regions of upper portion of the BOX layer prevents oxygen absorption into the gate dielectric layer as a result of thermal processing.

BRIEF DESCRIPTION OF THE SEVERAL VIEWS OF THE DRAWINGS

Referring to the exemplary drawings wherein like elements are numbered alike in the several Figures.

DETAILED DESCRIPTION

In current SOI-based finFET devices, the gate dielectric layer is in direct contact with the buried oxide layer (e.g., $SiO_2$) below the semiconductor fins. However, it has been discovered that high-k metal gate (HKMG) exposure to oxygen rich materials may cause severe threshold shift and/or regrowth issues. Because threshold voltage stability and the elimination of gate dielectric regrowth are important parameters for good device operation, it is desirable to be able to eliminate voltage shift or regrowth caused by oxygen rich materials beneath the high-k gate dielectric layer.

Accordingly, disclosed herein is a structure and method of prevention of oxygen absorption into high-k gate dielectric of silicon-on-insulator based finFET devices. Briefly stated, a nitrided layer is introduced at the surface of the buried oxide (BOX) layer, in between adjacently patterned fin structures, prior to deposition of the high-k gate dielectric layer. In so doing, the high-temperature conditions associated with the finFET device formation are prevented from adversely causing oxygen from the $SiO_2$ box layer to be introduced into the gate dielectric layer.

Figure 1:
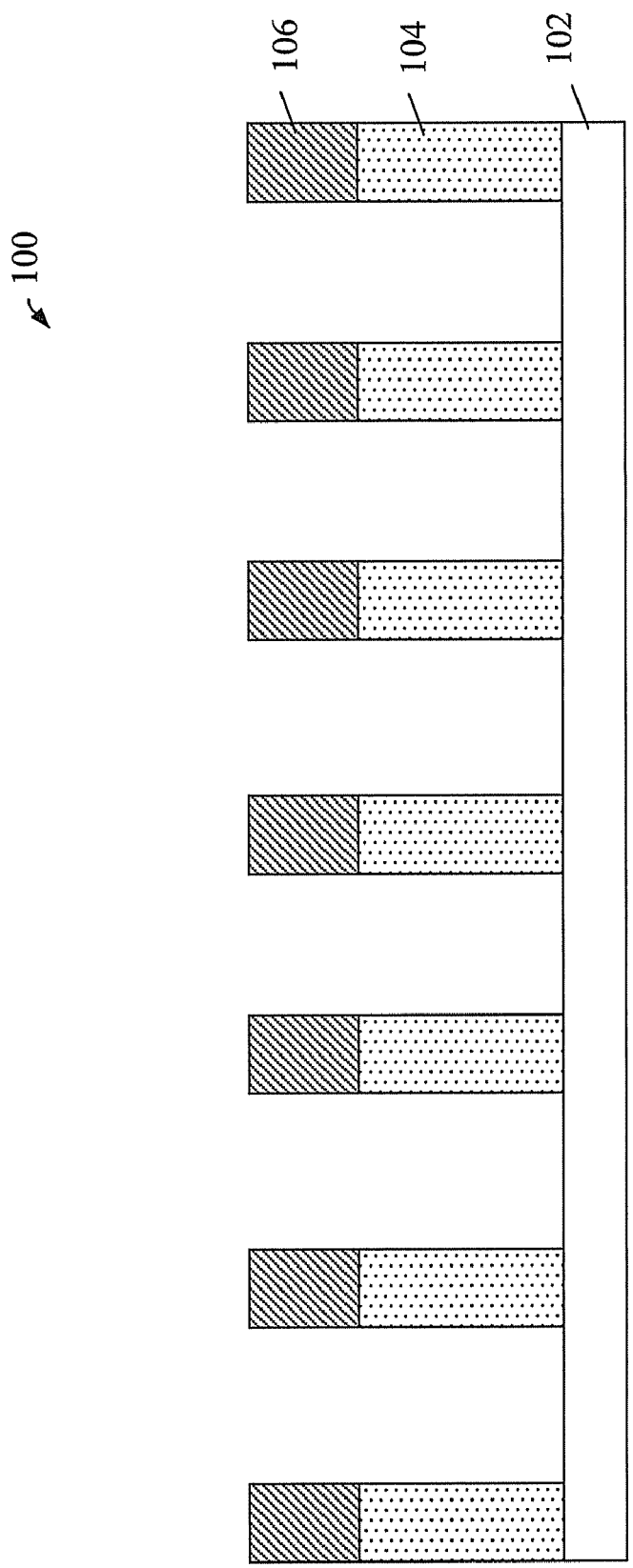
FIG. 1 is a cross-sectional view of a finFET device shown at a point of manufacture subsequent to the initial formation of fin structures defined in an SOI layer.

Referring initially to FIG. 1, there is shown a cross-sectional view of a finFET device 100 shown at a point of manufacture subsequent to the initial formation of fin structures defined in an SOI layer. More specifically, FIG. 1 illustrates a BOX layer 102 (formed over a base substrate, not shown), and a plurality of patterned fin structures or fins 104 formed from a semiconductor layer (e.g., silicon). A hardmask layer or layers 106, defining the fin patterned into the SOI layer is also shown in FIG. 1. Additional details regarding the formation of the initial semiconductor fin structures for finFET devices are well known to those skilled in the art, and are not described in further detail herein.

Figure 2:
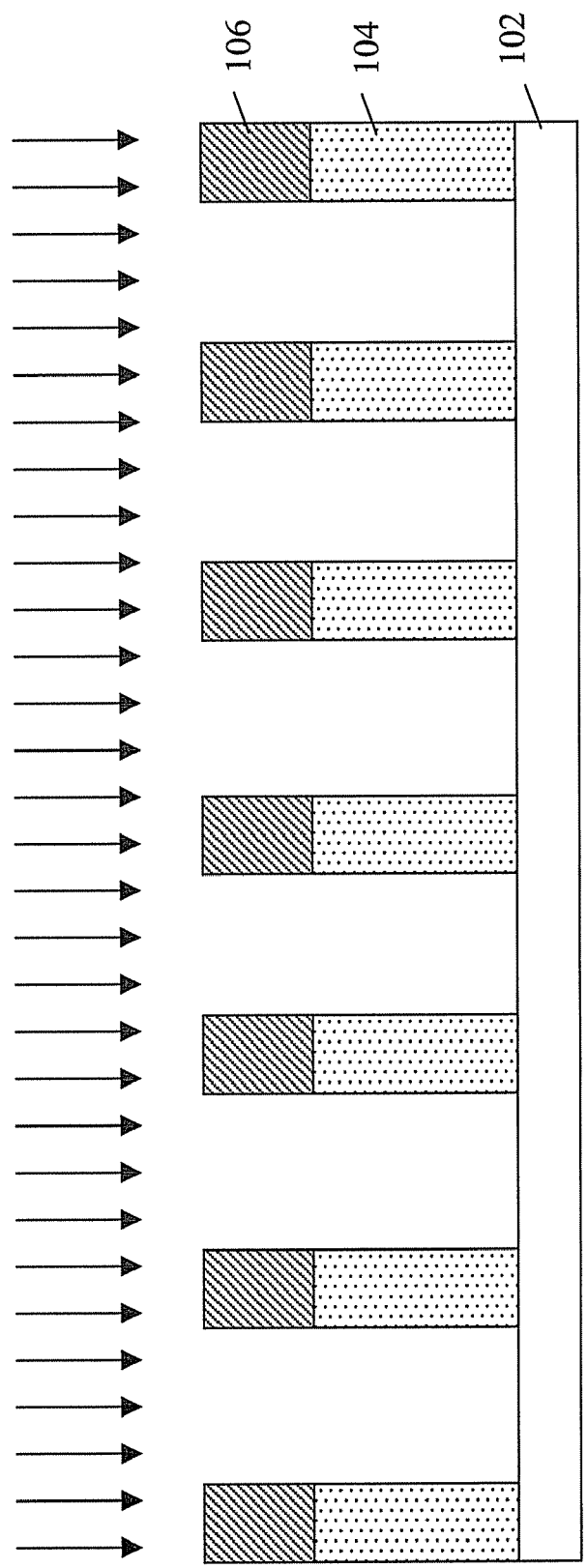
FIGS. 2 and 3 illustrate the device of FIG. 1 subjected to a vertical ion implantation of a nitrogen species, followed by a high-temperature anneal so as to form nitride regions in the upper portions of the BOX layer between fin structures, in accordance with an embodiment of the invention.
Figure 3:
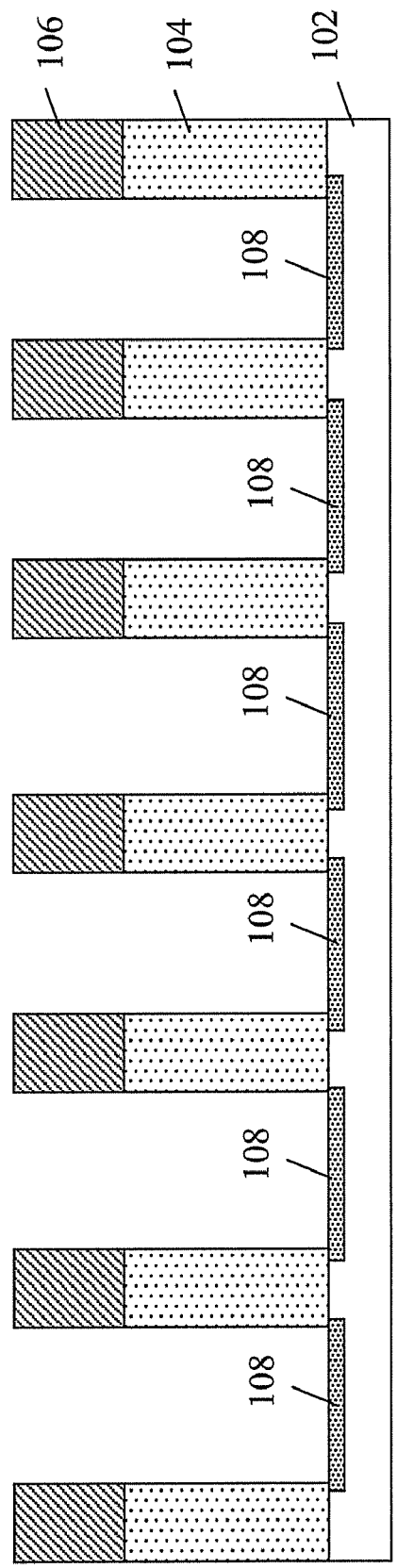

At this point, the structure shown in FIG. 1 would (in conventional processing) then be subject to gate dielectric material deposition. However, as indicated above, the formation of a gate dielectric layer on the structure of FIG. 1 would result in portions of the gate dielectric layer between fin structures 104 being in direct contact with the oxygen rich BOX layer 102. In turn, such direct contact leads to variations in finFET threshold voltage and gate dielectric regrowth. Thus, as shown in FIG. 2, the device is subjected to a vertical ion implantation of a nitrogen species (indicated by the arrows), followed by a high-temperature anneal. As a result, nitride regions 108 are formed in the upper portions of the BOX layer 102 between fin structures 104 as shown in FIG. 3.

Figure 4:
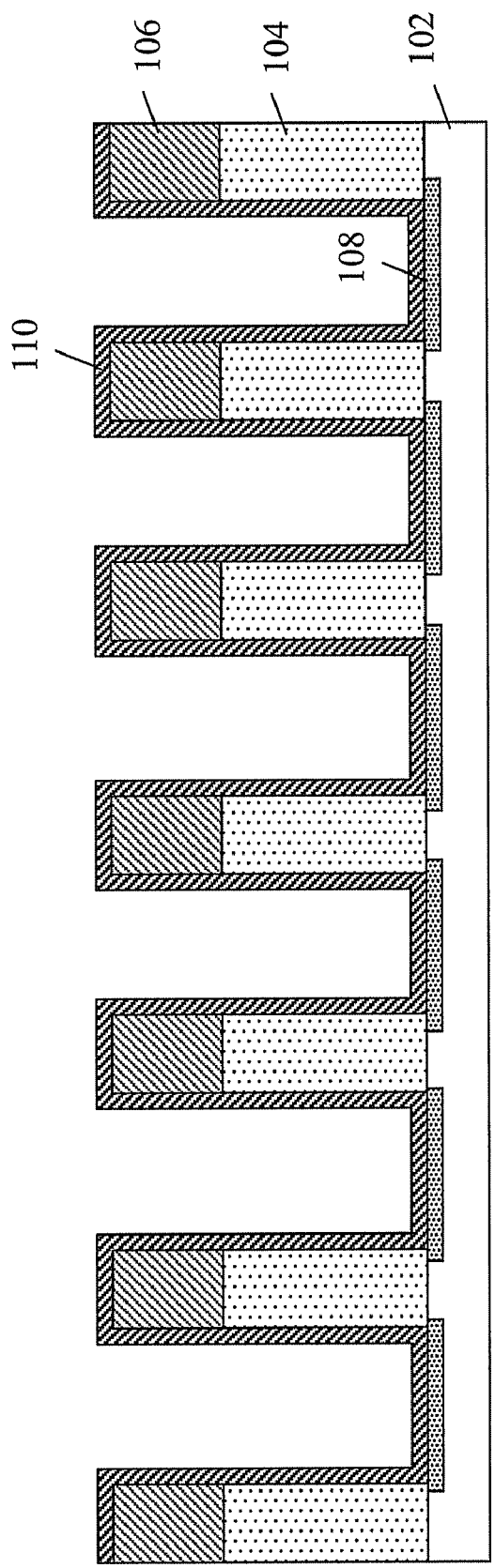
FIG. 4 illustrates the formation of a high-k gate dielectric layer over the structure of FIG. 3, including the fin structures, hardmask layer(s), and nitride regions in the upper portions of the BOX layer.

Then, as shown in FIG. 4, a high-k gate dielectric layer 110 is formed over the entire structure, including the fin structures 104, hardmask layer(s) 106, and nitride regions 108 in the upper portions of the BOX layer 102. The nitride regions 108 prevent diffusion of oxygen atoms from the BOX layer into the high-k gate dielectric layer 110. Exemplary high-k gate dielectric materials include, but are not limited to, for example, hafnium (Hf) based gate dielectrics, such as hafnium dioxide and hafnium silicate, zirconium oxide, zirconium silicate, nitrided dielectrics, as well as combinations thereof.

It will be noted that for a dual gate finFET structure (i.e., where the conducting channel is defined on two surfaces of the semiconductor fin), the hardmask layer(s) 106 remains atop the fin structures 104 during gate dielectric layer deposition. However, it is also contemplated that the hardmask layer(s) 106 may be removed prior to gate dielectric layer deposition in accordance with a tri-gate finFET structure, where the channel is defined in the top surface, as well as the sidewall surfaces of the fins.

Figure 5:
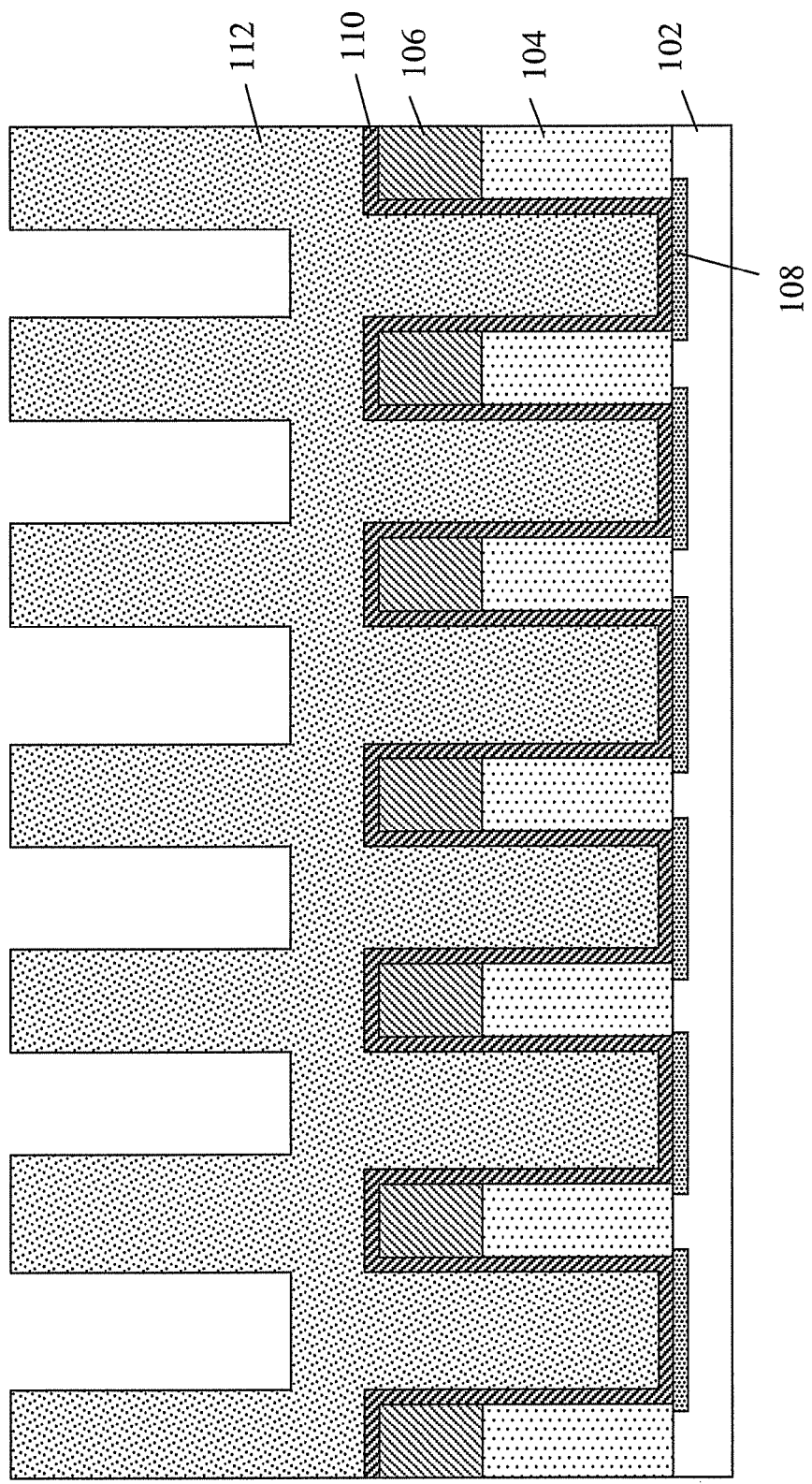
FIGS. 5 and 6 illustrate one or more gate electrode materials formed over the high-k dielectric layer so as to define a gate electrode layer for finFET devices.
Figure 6:
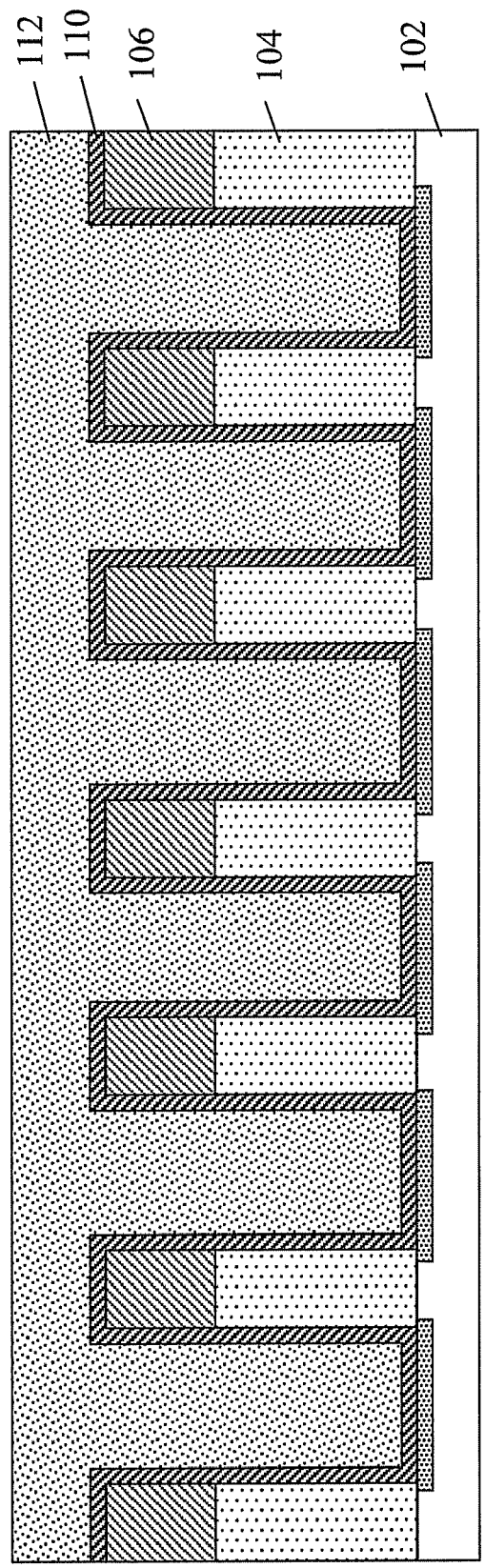

Following the formation of the high-k dielectric layer 110, now insulated from oxygen penetration by the nitride layer barriers 108, one or more gate electrode materials are formed over the high-k dielectric layer 110 so as to define a gate electrode layer 112, as shown in FIG. 5. In an exemplary embodiment, the gate electrode layer 112 may include one or more metals such as, for example, titanium nitride (TiN), tantalum nitride (TaN), tantalum silicon nitride (TaSiN), tungsten (W), platinum (Pt), aluminum (Al), as well as alloys of the above materials. In addition, polysilicon may also be included within the gate electrode layer 112, either directly above the high-k dielectric layer 110 or above metal material in the gate electrode layer 112. Following planarization of the gate electrode layer 112 as shown in FIG. 6, the device is then ready for further processing as known in the art. For example, the planarized gate electrode layer surface is then prepared for gate (PC) patterning through the use of additional hardmask layer deposition, lithography, and etching.

Figure 7:
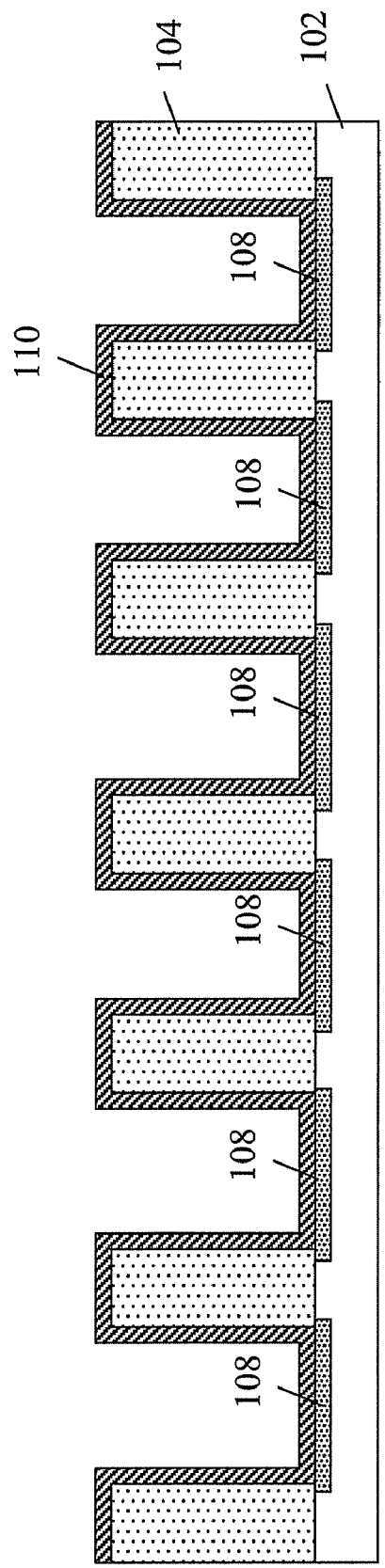
FIG. 7 illustrates an alternative embodiment of the formation of a high-k gate dielectric layer over the fin structures, and nitride regions in the upper portions of the BOX layer.
Figure 8:
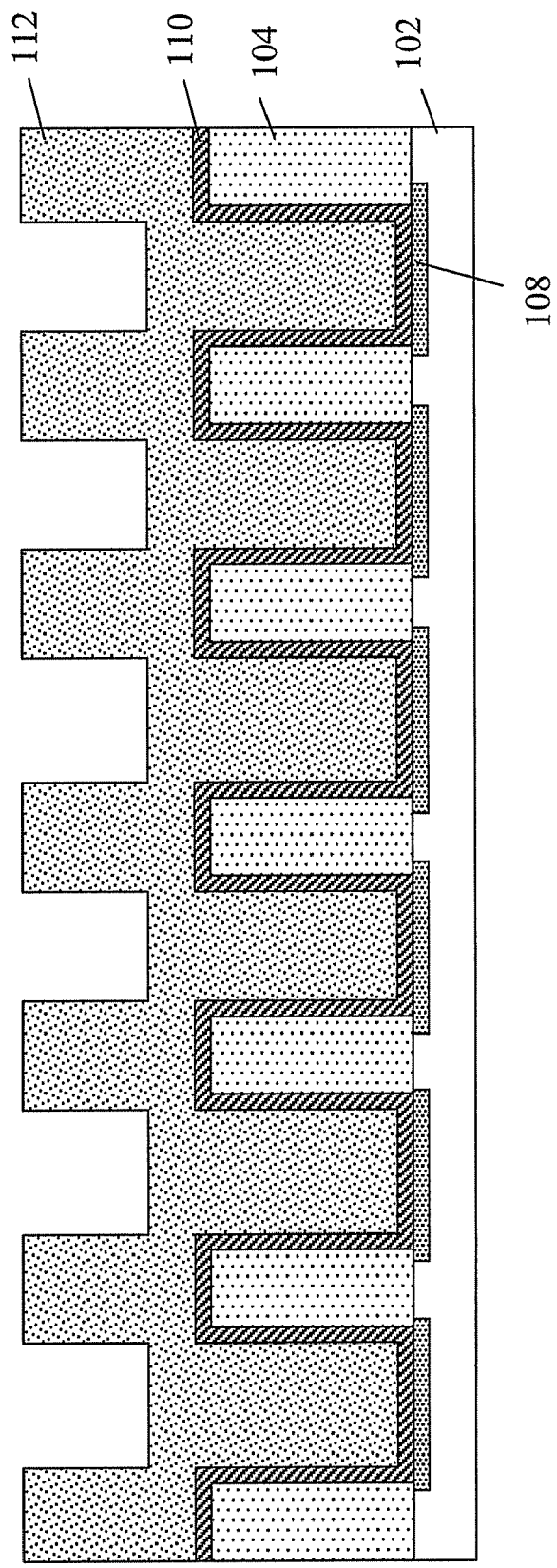
FIGS. 8 and 9 illustrate one or more gate electrode materials formed over the high-k dielectric layer so as to define a gate electrode layer for finFET devices.
Figure 9:
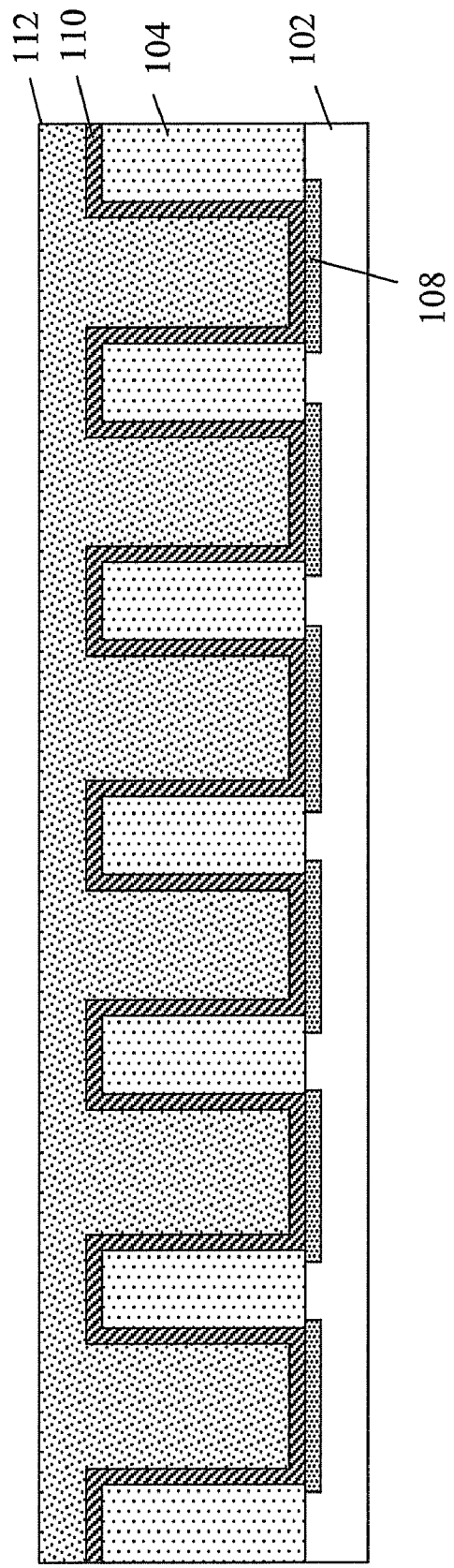

As indicated above, the disclosed BOX nitridation technique can, in an alternative embodiment, also be used in conjunction with tri-gate finFET structure, where the channel is defined in the top surface, as well as the sidewall surfaces of the fins. As shown in FIG. 7, the high-k gate dielectric layer 110 is formed over the entire structure, including the fin structures 104, and nitride regions 108 in the upper portions of the BOX layer 102. That is, the hardmask layer(s) 106 of FIG. 3 is removed following the nitrogen implant step. Thus, when the high-k gate dielectric layer 110 is formed, it also covers the top surfaces of the fin structures 104. Finally, FIGS. 8 and 9 illustrate deposition and planarization of the gate electrode layer 112.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming fin field effect transistor (finFET) devices, the method comprising:
   forming a plurality of semiconductor fins over a buried oxide (BOX) layer;
   performing a nitrogen implant so as to form nitrided regions in an upper portion of the BOX layer corresponding to regions between the plurality of semiconductor fins;
   forming, subsequent to the nitrogen implant, a gate dielectric layer over the semiconductor fins and entirely over the nitrided regions of the upper portion of the BOX layer, such that both horizontal and vertical portions of the gate dielectric layer are disposed over the nitrided regions; and
   forming one or more gate electrode materials over the gate dielectric layer;
   wherein the presence of the nitrided regions of upper portion of the BOX layer prevents oxygen absorption into the gate dielectric layer as a result of thermal processing.

2. The method of claim 1, wherein the gate dielectric layer has a dielectric constant of about 3.9 or greater.

3. The method of claim 2, wherein the gate dielectric layer comprises one of more of: hafnium dioxide, hafnium silicate, zirconium oxide, zirconium silicate, nitrides, and combinations thereof.

4. The method of claim 2, wherein the gate electrode layer comprises a metal material.

5. The method of claim 2, wherein the gate electrode layer comprises a metal material.

6. The method of claim 1, wherein the gate dielectric layer is also formed over a hardmask layer atop the plurality semiconductor fins, the hardmask layer used for patterning the plurality of semiconductor fins 7. The method of claim 1, further comprising performing an anneal subsequent to the performing a nitrogen implant, and prior to the forming a gate dielectric layer.

8. The method of claim 1, wherein the gate dielectric layer is formed directly on sidewall and top surfaces of the plurality of semiconductor fins.

9. A fin field effect transistor (finFET) device, comprising:
   a plurality of semiconductor fins formed over a buried oxide (BOX) layer;
   a plurality of nitrided regions formed in an upper portion of the BOX layer corresponding to regions between the plurality of semiconductor fins;
   a gate dielectric layer formed over the semiconductor fins and entirely over the plurality of nitrided regions of the upper portion of the BOX layer, such that both horizontal and vertical portions of the gate dielectric layer are disposed over the nitrided regions; and
   one or more gate electrode materials formed over the gate dielectric layer;
   wherein the presence of the nitrided regions of upper portion of the BOX layer prevents oxygen absorption into the gate dielectric layer as a result of thermal processing.

10. The finFET device of claim 9, wherein the gate dielectric layer has a dielectric constant of about 3.9 or greater.

11. The finFET device of claim 10, wherein the gate dielectric layer comprises one of more of: hafnium dioxide, hathium silicate, zirconium oxide, zirconium silicate, nitrides, and combinations thereof.

12. The finFET device of claim 10, wherein the gate electrode layer comprises a metal material.

13. The finFET device of claim 12, wherein the gate electrode layer comprises one or more of: titanium nitride (TiN), tantalum nitride (TaN), tantalum silicon nitride (TaSiN), tungsten (W), platinum (Pt), aluminum (Al), as well as alloys thereof.

14. The finFET device of claim 9, wherein the gate dielectric layer is also formed over a hardmask layer atop the plurality semiconductor fins, the hardmask layer used for patterning the plurality of semiconductor fins.

15. The finFET device of claim 9, wherein the gate dielectric layer is formed directly on sidewall and top surfaces of the plurality of semiconductor fins.

* * * * *